(12) United States Patent
Sawabe et al.

(10) Patent No.: US 11,581,329 B2
(45) Date of Patent: Feb. 14, 2023

(54) SEMICONDUCTOR MEMORY DEVICE

(71) Applicant: Kioxia Corporation, Minato-ku (JP)

(72) Inventors: Ryosuke Sawabe, Yokkaichi (JP);
Yasuhiro Uchiyama, Yokkaichi (JP);
Hiroshi Itokawa, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 243 days.

(21) Appl. No.: 16/999,149

(22) Filed: Aug. 21, 2020

(65) Prior Publication Data
US 2021/0057446 A1   Feb. 25, 2021

(30) Foreign Application Priority Data

Aug. 22, 2019 (JP) .............................. JP2019-152282

(51) Int. Cl.
*H01L 27/11582* (2017.01)
*G11C 16/04* (2006.01)
*H01L 27/11565* (2017.01)

(52) U.S. Cl.
CPC .... *H01L 27/11582* (2013.01); *G11C 16/0483* (2013.01); *H01L 27/11565* (2013.01)

(58) Field of Classification Search
CPC ............................................... H01L 27/11582
See application file for complete search history.

(56) References Cited

U.S. PATENT DOCUMENTS

| | | | |
|---|---|---|---|
| 8,247,857 B2 | 8/2012 | Ozawa et al. | |
| 8,507,972 B2 | 8/2013 | Oota et al. | |
| 9,293,543 B2 | 3/2016 | Azumo et al. | |
| 9,673,217 B1 | 6/2017 | Sakata et al. | |
| 2012/0120728 A1* | 5/2012 | Kim | G11C 5/063 257/315 |

FOREIGN PATENT DOCUMENTS

| | | |
|---|---|---|
| JP | 2009-295617 A | 12/2009 |
| JP | 2014-75451 A | 4/2014 |

* cited by examiner

*Primary Examiner* — Christopher A Johnson
(74) *Attorney, Agent, or Firm* — Oblon, McClelland, Maier & Neustadt, L.L.P.

(57) ABSTRACT

A semiconductor memory device comprises a semiconductor, a first insulator, a second insulator, a first conductor, a third insulator, a fourth insulator, and a fifth insulator. The first insulator is on the semiconductor. The second insulator is on the first insulator. The third insulator is on the first conductor. The fourth insulator is between the second insulator and the first conductor. The fifth insulator is provided between the second insulator and the third insulator. The fifth insulator is having an oxygen concentration different from an oxygen concentration of the fourth insulator.

19 Claims, 17 Drawing Sheets

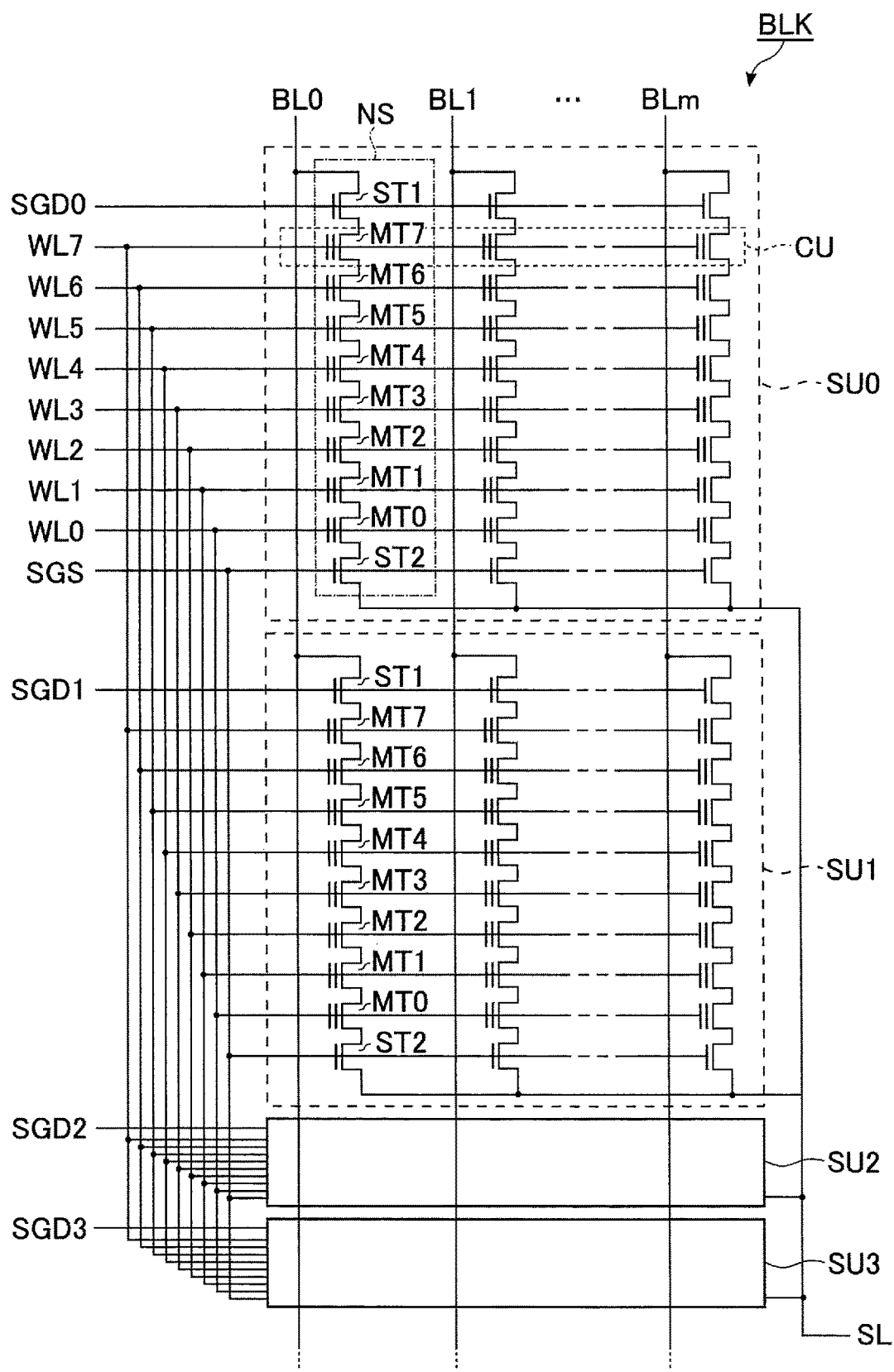
F I G. 2

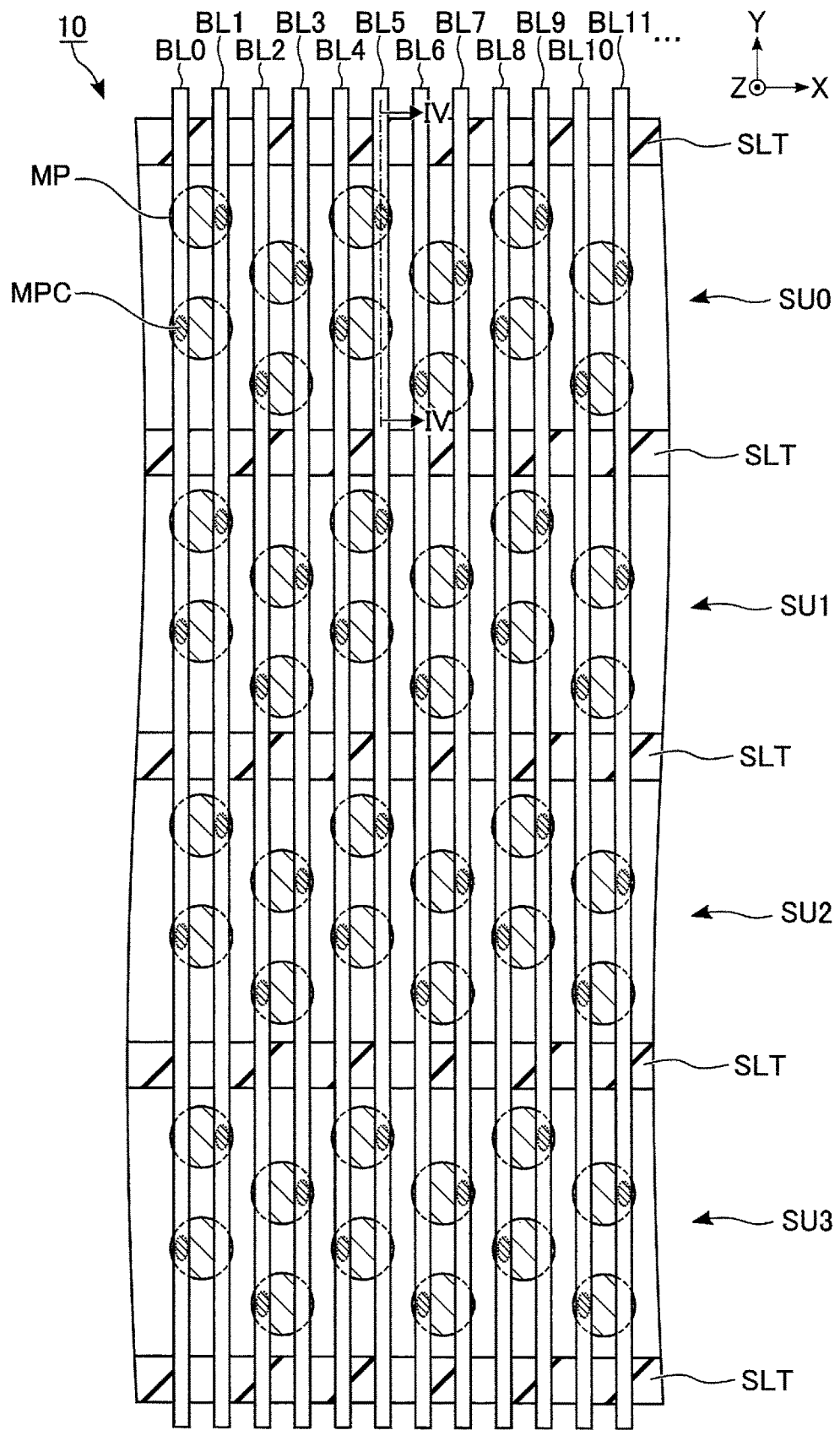
F I G. 3

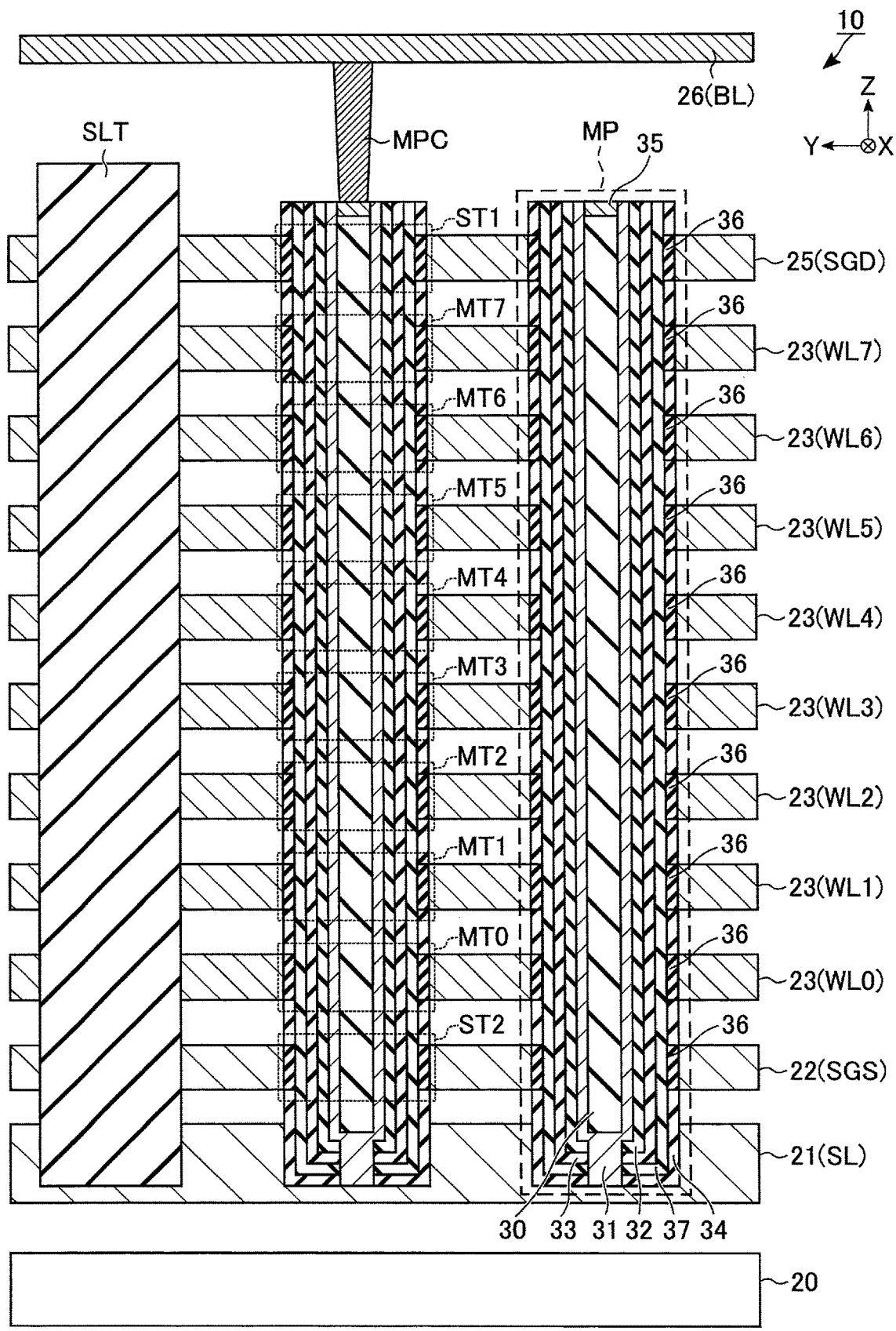
F I G. 4

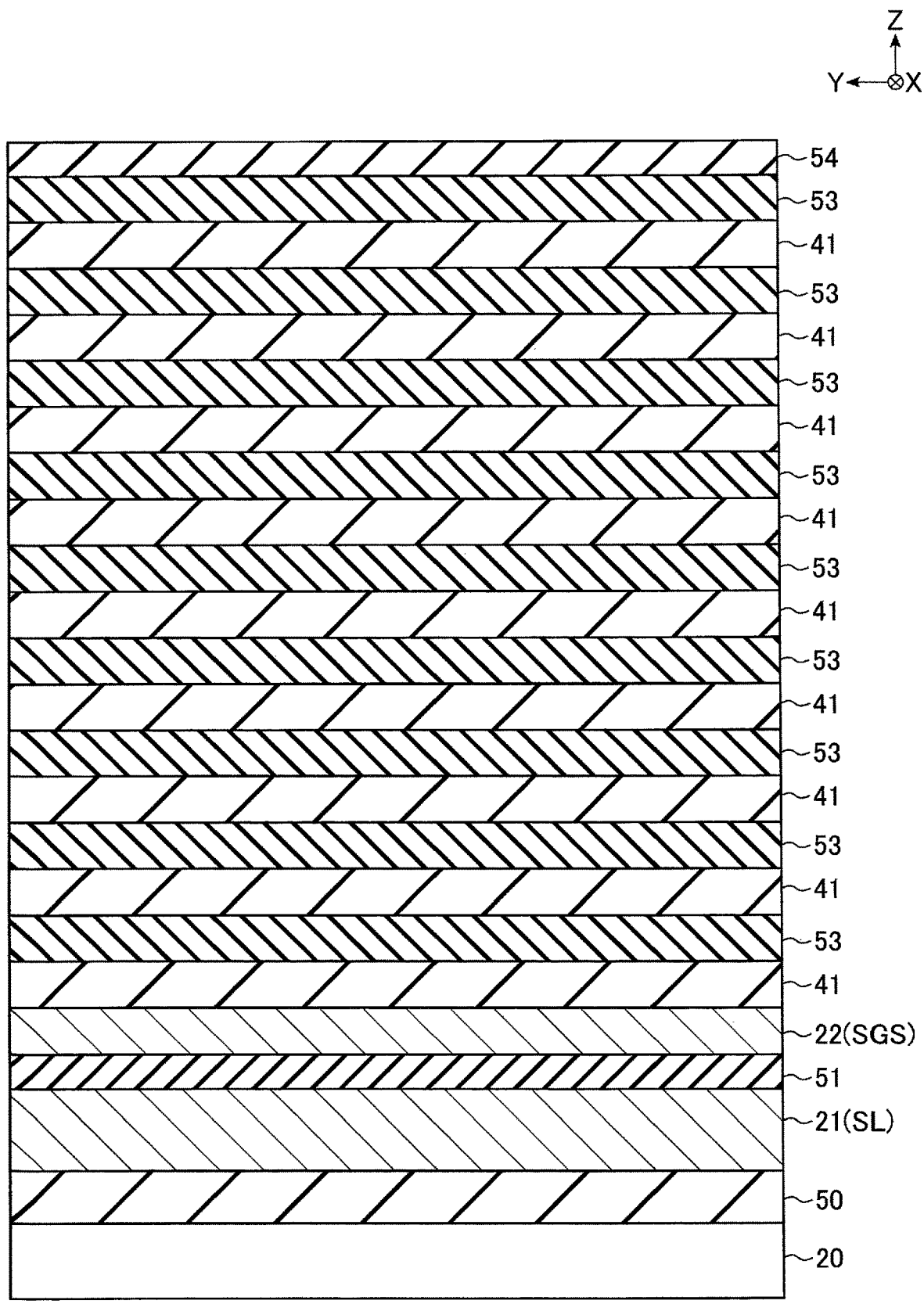
F I G. 6

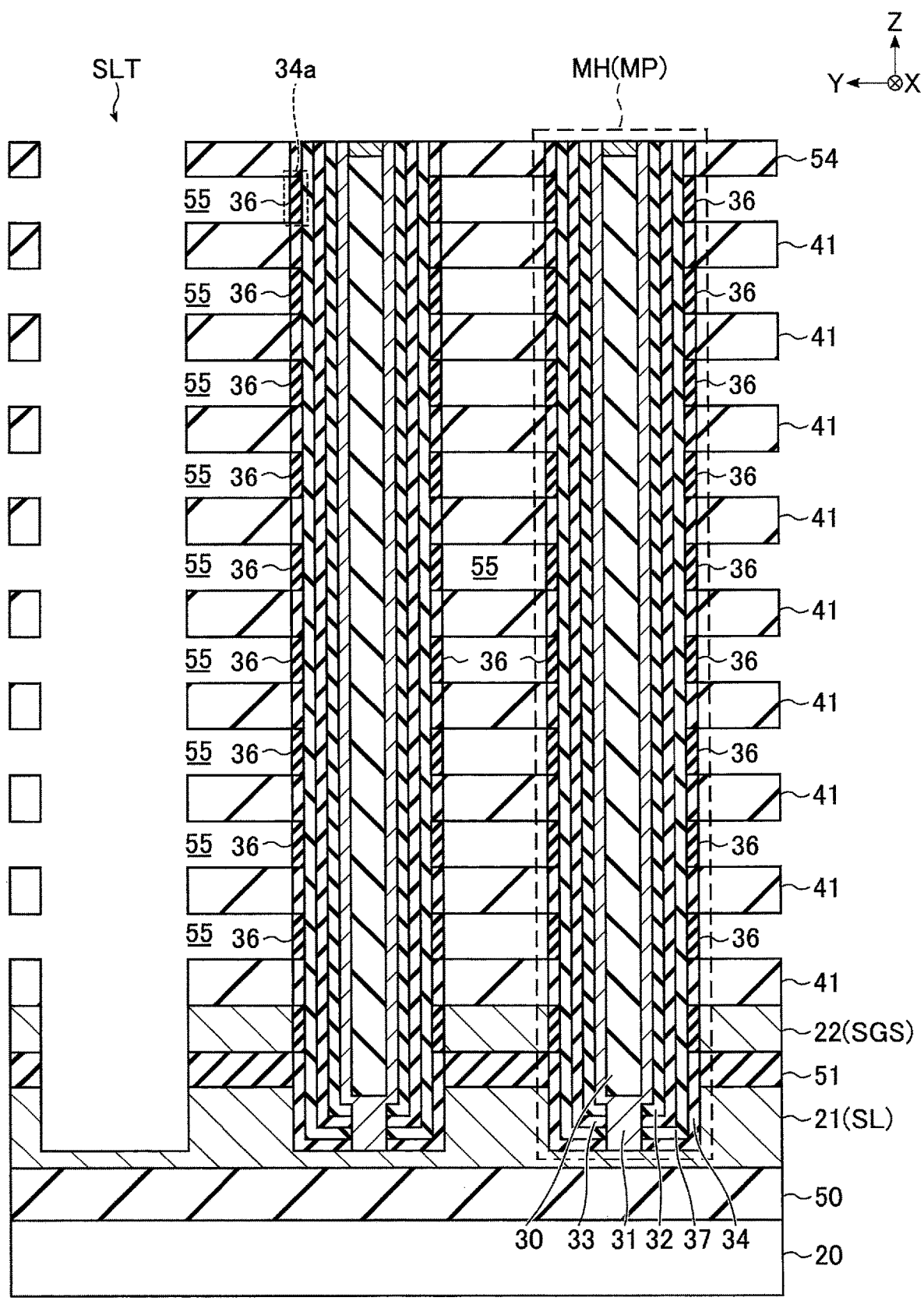
F I G. 12

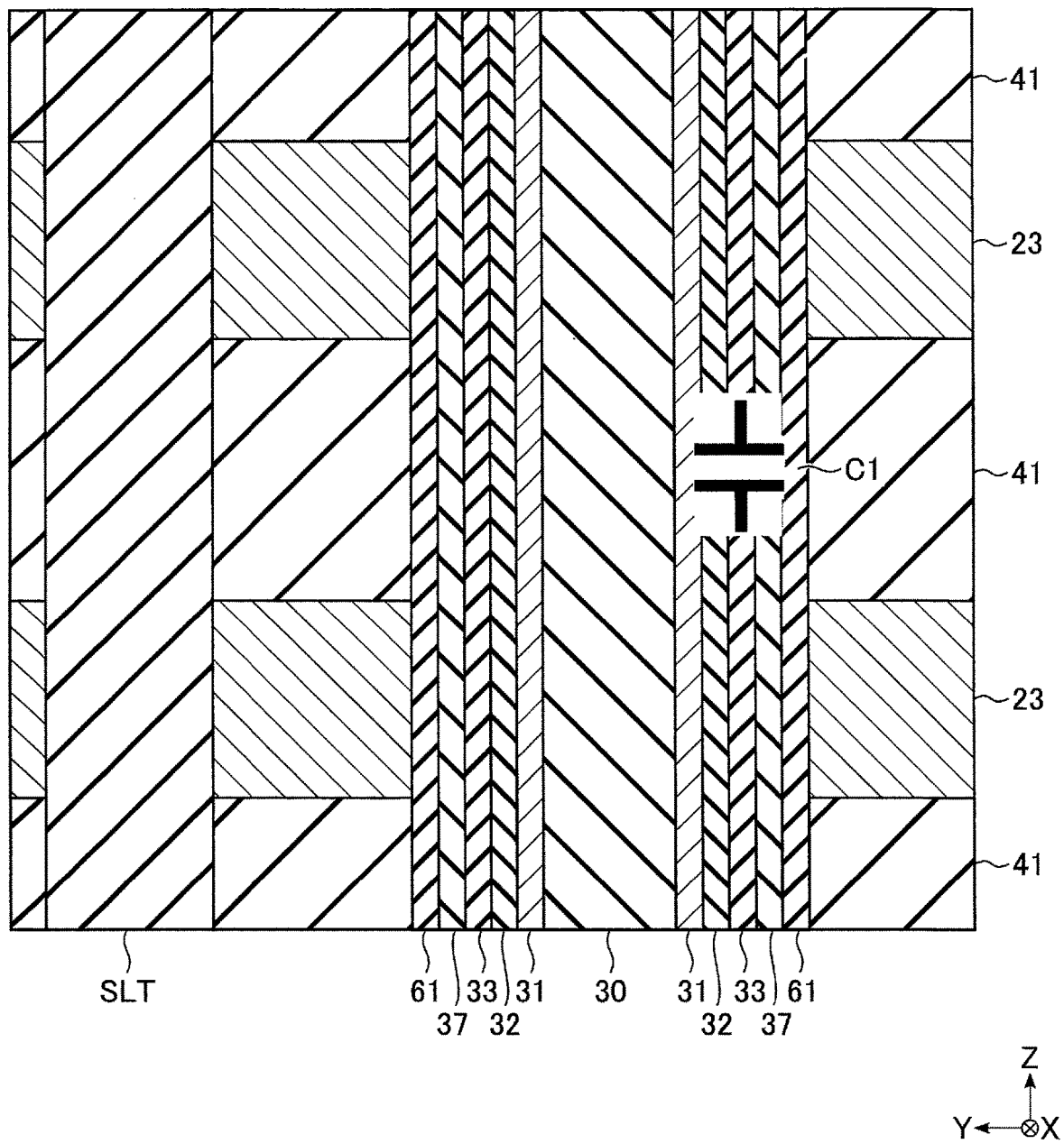
F I G. 14

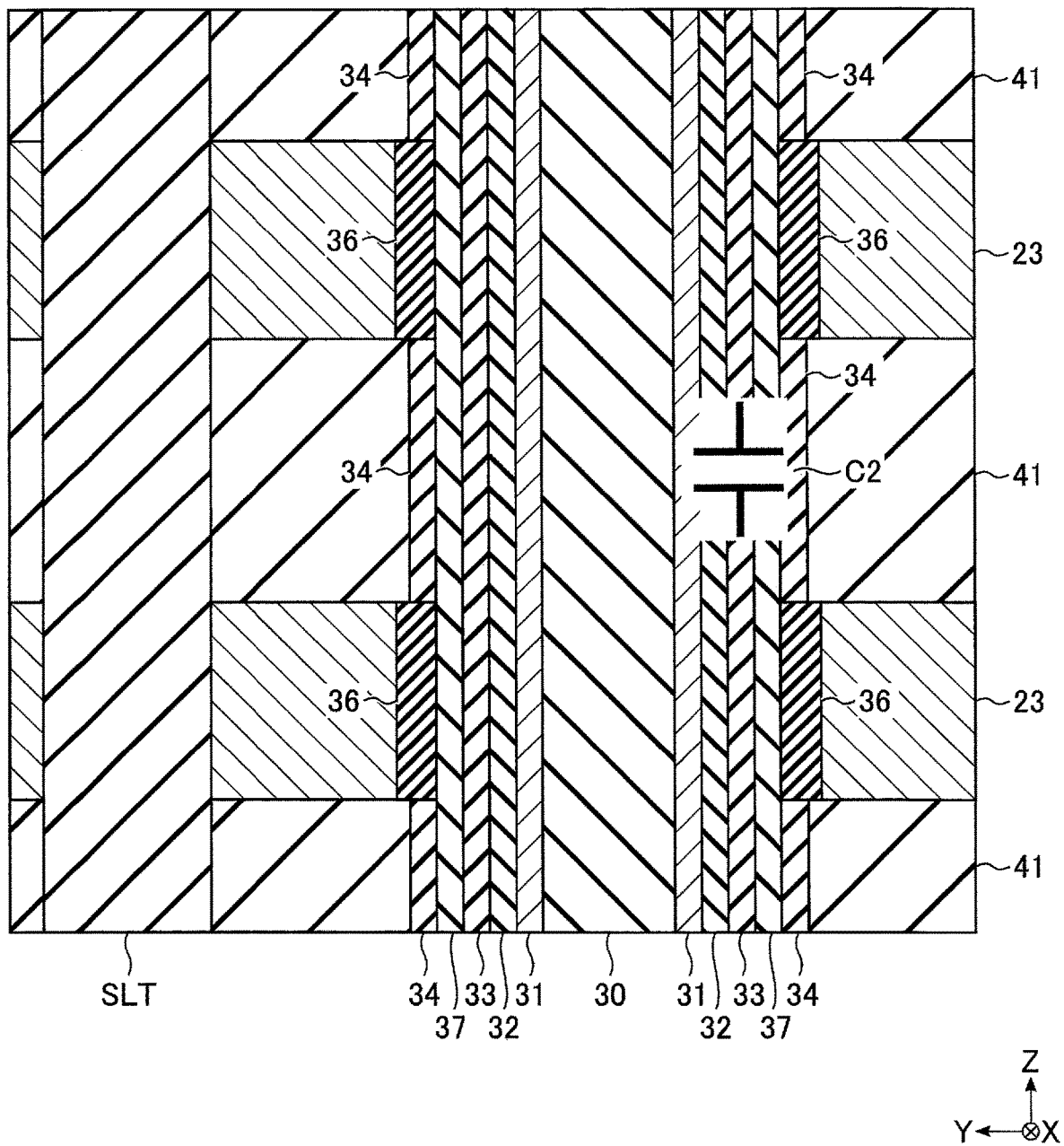
F I G. 15

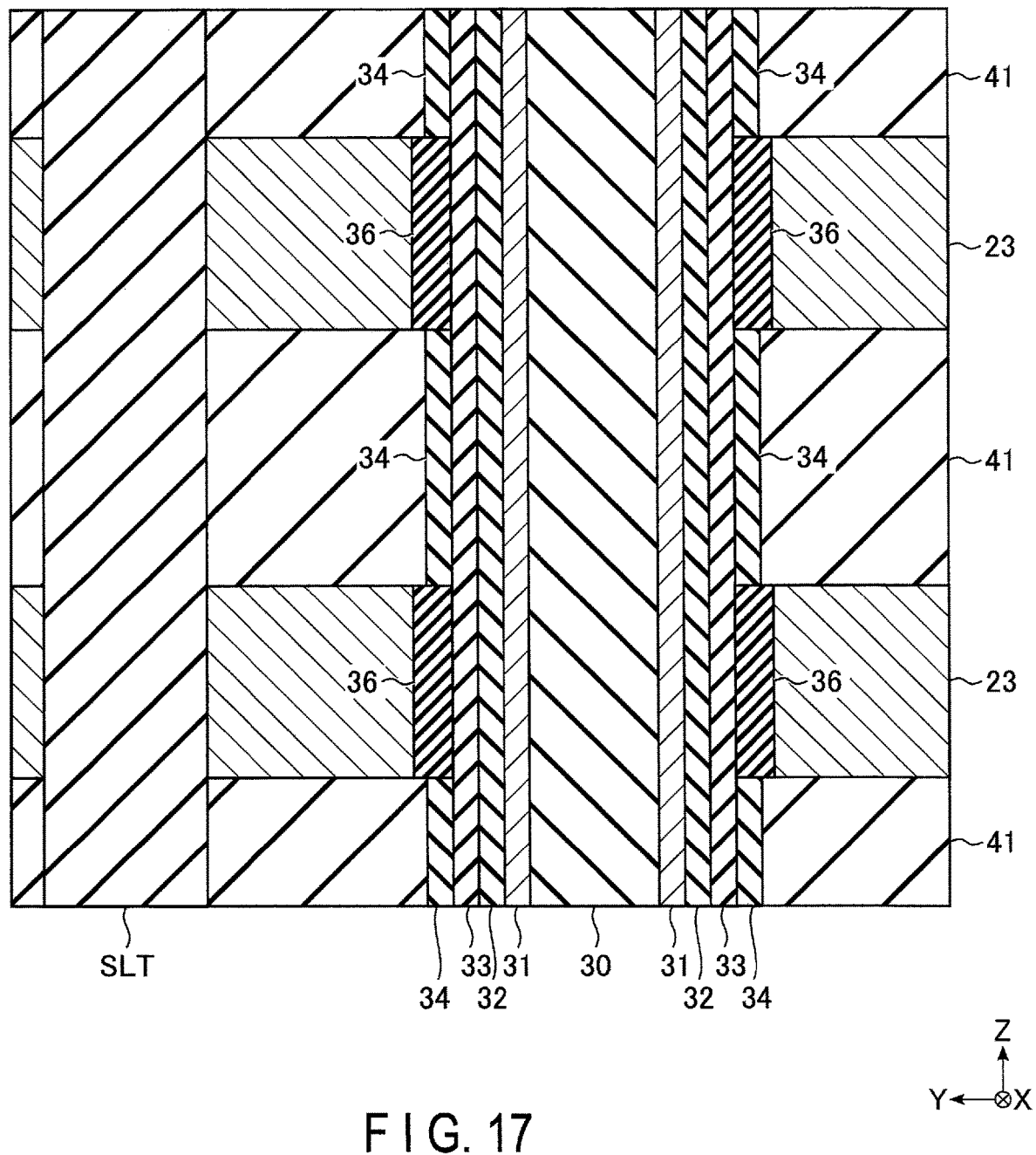
F I G. 17

SEMICONDUCTOR MEMORY DEVICE

CROSS-REFERENCE TO RELATED APPLICATIONS

This application is based upon and claims the benefit of priority from Japanese Patent Application No. 2019-152282, filed Aug. 22, 2019, the entire contents of which are incorporated herein by reference.

FIELD

Embodiments described herein relate generally to a semiconductor memory device.

BACKGROUND

A NAND-type flash memory, which is capable of storing data in a non-volatile manner, is known.

BRIEF DESCRIPTION OF THE DRAWINGS

FIG. 2 is a circuit diagram showing an example of a circuit configuration of a memory cell array included in the semiconductor memory device according to the first embodiment.

FIG. 3 is a plan view showing an example of a planar layout of the memory cell array included in the semiconductor memory device according to the first embodiment.

FIG. 4 is a cross-sectional view taken along line IV-IV of FIG. 3, and shows an example of a cross-sectional structure of the memory cell array included in the semiconductor memory device according to the first embodiment.

FIGS. 6 to 12 are cross-sectional views of the memory cell array, showing examples of cross-sectional structures in the course of manufacturing of the semiconductor memory device according to the first embodiment.

FIG. 14 shows a cross-sectional view of a memory cell array showing an example of a coupling capacitance in the semiconductor memory device according to a reference example.

FIG. 15 is a cross-sectional view of a memory cell array showing an example of a coupling capacitance in FIG. 5.

FIG. 17 is an enlarged view of part of FIG. 16.

DETAILED DESCRIPTION

Figure 1:
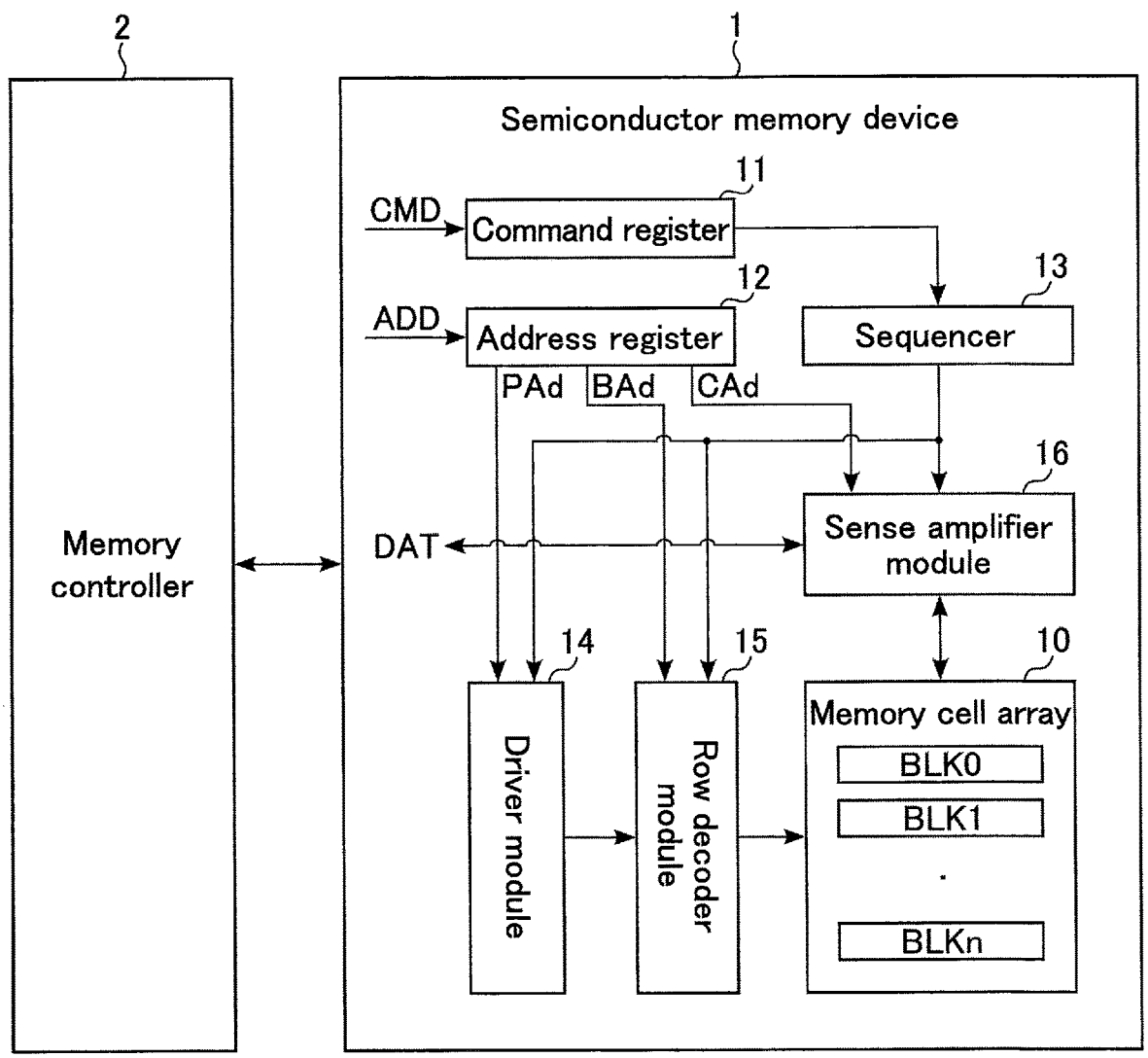
FIG. 1 is a block diagram showing a configuration example of a semiconductor memory device according to a first embodiment.

A semiconductor memory device comprises a semiconductor, a first insulator, a second insulator, a first conductor, a third insulator, a fourth insulator, and a fifth insulator. The first insulator is on the semiconductor. The second insulator is on the first insulator. The third insulator is on the first conductor. The fourth insulator is between the second insulator and the first conductor. The fifth insulator is provided between the second insulator and the third insulator. The fifth insulator is having an oxygen concentration different from an oxygen concentration of the fourth insulator.

Hereinafter, embodiments will be described with reference to the accompanying drawings. Each of the embodiments describes a device or method for embodying the technical idea of the embodiments. The drawings are schematic or conceptual, and the dimensions, ratios, etc. in the drawings are not always the same as the actual ones. The entire description of an embodiment is applicable to another embodiment, unless otherwise expressly or implicitly excluded. The technical idea of the present embodiment is not specified by the shapes, configurations, arrangements, etc. of the structural components.

In the description that follows, structural components having substantially the same function and configuration will be denoted by the same reference symbol. A numeral following letters constituting a reference symbol is used to distinguish between components referred to by reference symbols including the same letters and having the same configuration. If components represented by reference symbols including the same letters need not be distinguished, such components are referred to by reference symbols including only the same letters.

[1] First Embodiment

[1. 1.] Configuration (Structure)

Hereinafter, a semiconductor memory device 1 according to the embodiment will be described.

[1. 1. 1.] Configuration of Semiconductor Memory Device

FIG. 1 shows a configuration example of a semiconductor memory device 1 according to a first embodiment. The semiconductor memory device 1 is a NAND-type flash memory capable of storing data in a non-volatile manner. The semiconductor memory device 1 is controlled by an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0-BLKn (where n is an integer equal to or greater than 1). Each of the blocks BLK includes a set of memory cell transistors MT (not illustrated) capable of storing data in a non-volatile manner, and is used as, for example, a unit of data erasure. In the memory cell array 10, a source line SL, word lines WL, bit lines BL, etc. (not illustrated) are coupled. Each memory cell transistor is associated with, for example, a single bit line BL and a single word line WL. A detailed configuration of the memory cell array 10 will be described later.

The command register 11 stores a command CMD received by the semiconductor memory device 1 from the memory controller 2. The command CMD includes an instruction to cause, for example, the sequencer 13 to perform a read operation, a write operation, an erase operation, etc.

The address register 12 stores address information ADD received by the semiconductor memory device 1 from the memory controller 2. The address information ADD contains, for example, a block address BAd, a page address PAd, and a column address CAd. The block address BAd, the page address PAd, and the column address CAd are, for example, respectively used for selection of a block SLK, a word line WL, and bit lines BL.

The sequencer 13 controls the operation of the entire semiconductor memory device 1. For example, the sequencer 13 controls the driver module 14, the row decoder module 15, the sense amplifier module 16, etc. based on the command CMD stored in the command register 11, and performs a read operation, a write operation, an erase operation, etc.

The driver module 14 generates voltages used in a read operation, a write operation, an erase operation, etc., and supplies the generated voltages to the row decoder module 15. The driver module 14 applies the generated voltage to a signal line corresponding to the selected word line WL based on, for example, a page address PAd stored in the address register 12.

The row decoder module 15 selects a single block BLK in the corresponding memory cell array 10 based on the block address BAd stored in the address register 12. The row decoder module 15 transfers, for example, the voltage applied to the signal line corresponding to the selected word line WL to the selected word line WL in the selected block BLK.

In a write operation, the sense amplifier module 16 applies a voltage determined according to write data DAT received from the memory controller 2 to each bit line BL. In a read operation, the sense amplifier module 16 determines data stored in the memory cell transistor MT based on the voltage of the bit line BL, and transfers the result of the determination to the memory controller 2 as read data DAT.

A single semiconductor device may be configured by the above-described semiconductor memory device 1 and memory controller 2 in combination. Examples of such a semiconductor device include a memory card such as an SD™ card and a solid state drive (SSD).

[1. 1. 2.] Configuration of Memory Cell Array

FIG. 2 shows an example of a circuit configuration of the memory cell array 10 included in the semiconductor memory device 1 according to the first embodiment, in which one of the blocks BLK included in the memory cell array 10 is extracted. All the other blocks BLK are configured by, for example, the components and couplings shown in FIG. 2. The number of blocks BLK in the memory cell array 10 and the number of string units SU in a single block BLK can be set to a desired number. In the description that follows, an example will be given in which a single block BLK includes four string units SU0 to SU3.

Each string unit. SU is a set of NAND strings NS respectively associated with bit lines BL0 to BLm (where m is an integer equal to or greater than 1).

Each NAND string NS includes, for example, memory cell transistors MT0 to MT7 and select transistors ST1 and ST2. Each memory cell transistor MT includes a control gate and a charge storage layer, and stores data in a non-volatile manner. Each of the select transistors ST1 and ST2 is used for selection of a string unit SU in various operations.

In each NAND string NS, memory cell transistors MT0-MT7 are coupled in series. The drain of the select transistor ST1 is coupled to a bit line BL associated therewith, and the source of the select transistor ST1 is coupled to one end of a set of memory cell transistors MT0 to MT7 coupled in series. The drain of the select transistor ST2 is coupled to the other end of the set of memory cell transistors MT0 to MT7 coupled in series. The source of the select transistor ST2 is coupled to a source line SL.

Control gates of the memory cell transistors MT0 to MT7 in the same block BLK are commonly coupled to the word lines WL0 to WL7, respectively. Gates of the select transistors ST1 in the string units SU0-SU3 are commonly coupled to select gate lines SGD0-SGD3. Gates of the select transistors ST2 are commonly coupled to a select gate line SGS.

A single NAND string NS in each string unit SU is coupled to a single bit line BL. A source line SL is shared among, for example, a plurality of blocks BLK.

A set of memory cell transistors MT coupled to a common word line WL in a single string unit SU will be referred to as, for example, a cell unit CU. The storage capacity of a cell unit CU including a plurality of memory cell transistors MT each storing 1-bit data is defined as "1-page of data". The cell unit CU may have a storage capacity of 2 or more pages of data, according to the number of bits of data stored in the memory cell transistor MT.

A circuit configuration of the memory cell array 10 included in the semiconductor memory device 1 according to the first embodiment is not limited to the above-described configuration. For example, the number of memory cell transistors MT and the number of select transistors ST1 and ST2 included in each NAND string NS may be designed to be a desired number.

[1. 1. 3.] Planar Structure of Memory Cell Array

Hereinafter, an example of a structure of the memory cell array 10 according to the present embodiment will be described.

In the drawings to which reference will be made, a Y direction corresponds to a direction in which the bit lines BL extend, an X direction corresponds to a direction in which the word lines WL extend, and a Z direction corresponds to a direction vertical to a surface of the semiconductor substrate 20 (not illustrated) on which the semiconductor memory device 1 is formed. In planar views, hatching is applied where necessary for ease of reference. The hatching in the planar views is not necessarily associated with the material or characteristics of components to which hatching is applied. In cross-sectional views, components such as insulating layers (interlayer insulating films), interconnects, contacts, etc. are suitably omitted for ease of reference.

FIG. 3 shows an example of a planar layout of the memory cell array 10 included in the semiconductor memory device 1 according to the first embodiment, in which a region including a structure that functions as string units SU0 to SU3 is extracted. As shown in FIG. 3, the memory cell array 10 includes, for example, slits SLT, memory pillars MP, contacts MPC, and bit lines BL.

The slits SLT extend along the X direction, and are aligned in the Y direction. The slit SLT contains an insulator. The slit SLT partitions, for example, each of interconnect layers that function as word lines WL, an interconnect layer that functions as a select gate line SGD, and an interconnect layer that functions as a select gate line SGS.

Each of the regions separated by the slit SLT functions as a single string unit SU. Specifically, a slit SLT is arranged, for example, between the string units SU0 and SU', between the string units Sill and SU2, and between the string units SU2 and SU3 adjacent to each other as viewed in the Y direction. In the memory cell array 10, a layout similar to the layout shown in FIG. 3, for example, is repeatedly arranged in the Y direction.

The memory pillars MP are arranged in, for example, a 4-row staggered manner in a region that functions as, for example, a string unit SU. The number and arrangement of memory pillars MP between adjacent slits SLT is not limited thereto, and may be suitably varied. Each of the memory pillars MP functions as, for example, a single NAND string NS.

The bit lines BL extend along the Y direction, and are aligned in the X direction. Each of the bit lines BL in each string unit SU is arranged so as to overlap at least one memory pillar MP. Each memory pillar MP overlaps, for example, two bit lines BL. A contact MPC is provided between a memory pillar MP and one of the bit lines BL overlapping the memory pillar MP. Each memory pillar MP is electrically coupled to a single bit line BL via the contact MPC. Each contact MPC is coupled to a single bit line BL in each of the regions separated by the slit SLT. The number of bit lines BL overlapping each memory pillar MP may be designed to be a desired number.

[1. 1. 4.] Cross-Sectional Structure of Memory Cell Array

FIG. 4 is a cross-sectional view taken along line IV-IV of FIG. 3, and shows an example of a cross-sectional structure of the memory cell array 10 included in the semiconductor memory device 1 according to the first embodiment. As shown in FIG. 4, the memory cell array 10 includes, for example, conductive layers 21-23, 25, and 26, memory pillars MP, contacts MPC, and slits SLT. The conductive layers 21-23, 25, and 26 are provided above the semiconductor substrate 20. Hereinafter, a cross-sectional structure of the memory cell array 10 will be described.

The conductive layer 21 is provided above the semiconductor substrate 20 via an insulating layer. Although not illustrated, circuits such as a sense amplifier module 16, for example, are provided in an insulating layer between the semiconductor substrate 20 and the conductive layer 21. The conductive layer 21 is, for example, formed in a plate shape extending along the XY plane, and used as a source line SL. The conductive layer 21 contains, for example, silicon (Si).

The conductive layer 22 is provided above the conductive layer 21 via an insulating layer. The conductive layer 22 is, for example, formed in a plate shape extending along the XY plane, and used as a select gate line SGS. The conductive layer 22 contains, for example, tungsten (W).

An insulating layer and the conductive layer 23 are alternately stacked above the conductive layer 22. The conductive layers 23 are, for example, formed in a plate shape extending along the XY plane. The stacked conductive layers 23 are, from the side of the semiconductor substrate 20, respectively used as, for example, word lines WL0 to WL7. The conductive layers 23 contain, for example, tungsten.

The conductive layer 25 is provided above the topmost conductive layer 23 via an insulating layer. The conductive layer 25 is, for example, formed in a plate shape extending along the XY plane, and used as a select gate line SGD. The conductive layer 25 contains, for example, tungsten.

The conductive layers 26 are provided above the conductive layer 25 via an insulating layer. The conductive layers 26 are, for example, formed in a line shape extending along the Y direction, and are used as bit lines BL. The conductive layers 26 are aligned along the X direction in an unillustrated region. The conductive layers 26 contain, for example, copper (Cu).

The memory pillars MP extend along the Z direction, penetrate the conductive layers 22, 23, and 25, and are, at their bottom portions, in contact with the conductive layer 21.

Each of the memory pillars MP includes, for example, a core member 30, a semiconductor layer 31, a tunnel insulating film 32, an insulating film 33, block insulating films 37, 34, and 36, and a semiconductor layer 35.

Specifically, the core member 30 is provided so as to extend along the Z direction, and is provided at a central portion of the memory pillar MP. For example, an upper end of the core member 30 is included in a layer above a layer in which the conductive layer 25 is provided, and a lower end of the core member 30 is included in a layer in which the conductive layer 21 is provided. The core member 30 contains, for example, an insulator such as silicon oxide ($SiO_2$).

The semiconductor layer 31 includes, for example, a portion that covers a side surface and a bottom surface of the core member 30, and a pillar-shaped portion extending along the Z direction below a bottom surface of the core member 30. A bottom surface of the pillar-shaped portion of the semiconductor layer 31 is, for example, in contact with the conductive layer 21. The semiconductor layer 31 contains, for example, silicon.

The tunnel insulating film 32 covers a side surface and a bottom surface of the semiconductor layer 31, excluding a portion of a side surface of the pillar-shaped portion of the semiconductor layer 31. The tunnel insulating film 32 contains, for example, silicon oxide. The insulating film 33 covers a side surface and a bottom surface of the tunnel insulating film 32. The insulating film 33 contains, for example, silicon nitride (SiN). The block insulating film 37 covers a side surface and a bottom surface of the insulating film 33. The block insulating film 37 contains, for example, silicon oxide.

The block insulating film 34 covers a bottom surface of the block insulating film 37 and a portion of a side surface of the block insulating film 37 which is not adjacent to the conductive layers 22, 23 and 25. The block insulating films 36 are formed between the side surface of the block insulating film 37 and the conductive layers 22, 23, and 25. In other words, the block insulating film 34 and the block insulating film 36 are alternately formed on the side surface of the block insulating film 37 as viewed in the Z direction.

The block insulating film 36 contains a material having a higher dielectric constant than the block insulating film 34. The block insulating film 36 contains a material that changes to have a higher dielectric constant than the material of the block insulating film 34, through, for example, oxidation of the material of the block insulating film 34. Specifically, the block insulating film 34 contains a nitride of a first element (first material), and the block insulating film 36 contains an oxide of the first element. More specifically, the block insulating film 34 contains aluminum nitride, hafnium nitride, or zirconium nitride, and the block insulating film 36 contains, for example, aluminum oxide, hafnium oxide, or zirconium oxide.

The semiconductor layer 35 is included in a layer above the conductive layer 25, is in contact with, at its side surface, an inner wall of the semiconductor layer 31, and is in contact with, at its bottom surface, an upper surface of the core member 30. The semiconductor layer 35 and the semiconductor layer 31 are electrically coupled. The semiconductor layer 35 contains, for example, a material similar to that of the semiconductor layer 31.

A pillar-shaped contact MPC is provided on an upper surface of the semiconductor layer 31 and the semiconductor layer 35 in the memory pillar MP. In the illustrated region, a contact MPC that is coupled to one of two memory pillars MP is displayed. A contact MPC is coupled, in an unillustrated region, to the memory pillar MP to which a contact MPC is not coupled in the illustrated region. A single conductive layer 26, namely, a single bit line BL, is in contact with an upper surface of the contact MPC.

Each slit SLT is, for example, formed in a plate shape extending along the XZ plane, and partitions each of the conductive layers 22, 23, and 25. An upper end of the slit SLT is included in, for example, a layer between the conductive layer 25 and the conductive layer 26. A lower end of the slit SLT is included in, for example, a layer in which the conductive layer 21 is provided. The slit SLT contains, for example, an insulator such as silicon oxide.

In the structure of the memory pillar MP described above, a portion at which the memory pillar MP and the conductive layer 22 intersect functions as a select transistor ST2. Portions at which the memory pillar MP and the conductive layers 23 intersect respectively function as memory cell transistors MT. A portion at which the memory pillar MP and the conductive layer 25 intersects functions as a select transistor ST1.

That is, the semiconductor layer 31 is used as a channel of each of the memory cell transistors MT and the select transistors ST1 and ST2. The insulating film 33 is used as a charge storage layer of the memory cell transistor MT. Thereby, each of the memory pillars MP may function as a single NAND string NS.

Figure 5:
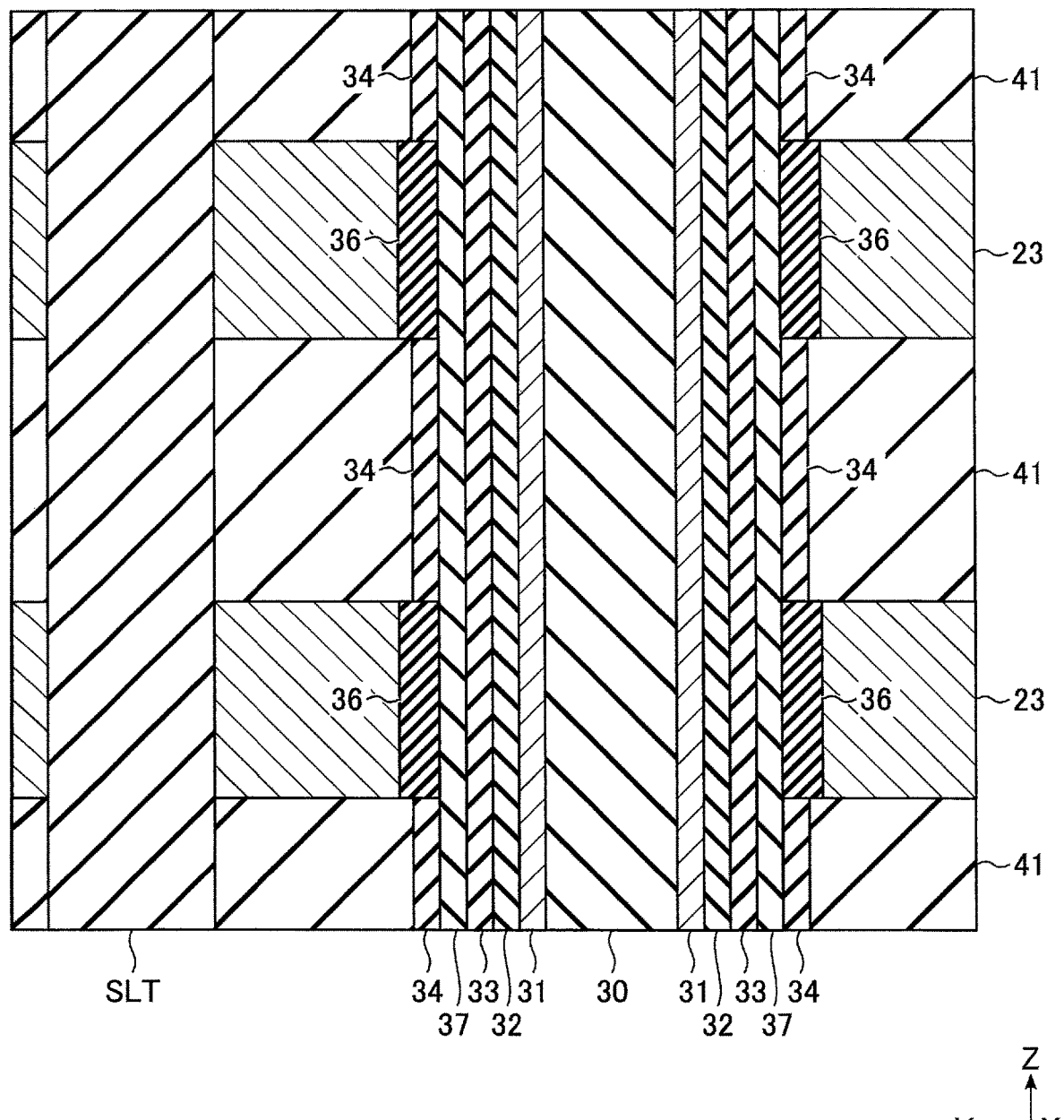
FIG. 5 is an enlarged view of part of FIG. 4.

FIG. 5 is an enlarged view of part of FIG. 4. A structure of the block insulating films 34 and 36 will be further described, with reference to FIG. 5. The block insulating film 36 is formed between the conductive layers 22, 23, and 25 and the block insulating film 37, but may be formed in a portion that is in contact with the insulating layer 41. That is, an upper end and a lower end of the block insulating film 36 may be formed between the block insulating film 37 and the insulating layer 41 above and/or below the block insulating film 36. Also, the block insulating film 36 may be formed to have a thickness larger than that of the block insulating film 34. FIG. 5 shows an example in which the block insulating film 36 has a thickness larger than the block insulating film 34. However, the block insulating film 36 may have substantially the same thickness as the block insulating film 34.

[1. 2.] Manufacturing Method

Hereinafter, an example of a sequence of manufacturing steps relating to formation of a stacked interconnect structure in the memory cell array 10 of the semiconductor memory device 1 according to the first embodiment will be described. Each of FIGS. 6-13 shows an example of a cross-sectional structure of the semiconductor memory device 1 according to the first embodiment in the course of manufacturing, showing a cross section similar to that of FIG. 4.

First, as shown in FIG. 6, sacrificial members 53 are stacked. The sacrificial members 53 are formed in regions in which conductive layers 22, which function as word lines WL or a select gate line SGD, are to be formed. Specifically, an insulating layer 50, a conductive layer 21, an insulating layer 51, and a conductive layer 22 are stacked in this order on the semiconductor substrate 20. Thereafter, an insulating layer 41 and a sacrificial member 53 are alternately stacked on the conductive layer 22, and an insulating layer 54 is formed on the topmost sacrificial member 53.

The insulating layers 51, 41, and 54 contain, for example, silicon oxide. The number of sacrificial members 53 formed is, for example, equal to the number of word lines WL stacked. The sacrificial members 53 contain, for example, silicon nitride.

Figure 7:
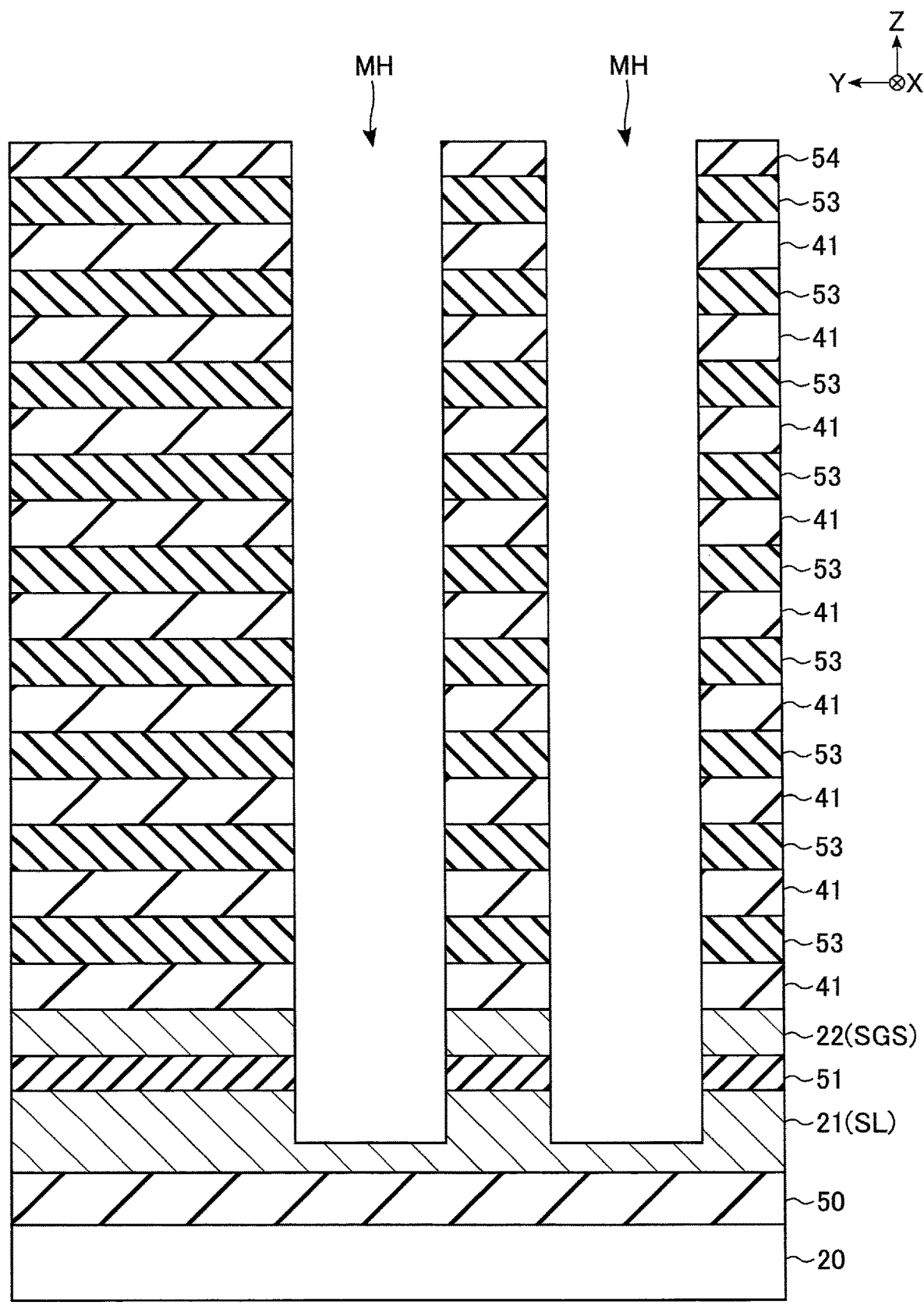

Subsequently, memory holes MH are formed, as shown in FIG. 7. Specifically, a mask including openings at regions where memory holes MH are to be formed is formed by, for example, lithography. Memory holes MH are formed by anisotropic etching using the formed mask.

Each memory hole MH formed in this step penetrates the insulating layers 51, 41, and 54, the sacrificial members 53, and the conductive layer 22, and the bottom portion of the memory hole MH is in an interior portion of the conductive layer 21 where the anisotropic etching stops. Reactive ion etching (RIE), for example, is employed as the anisotropic etching in this step.

Figure 8:
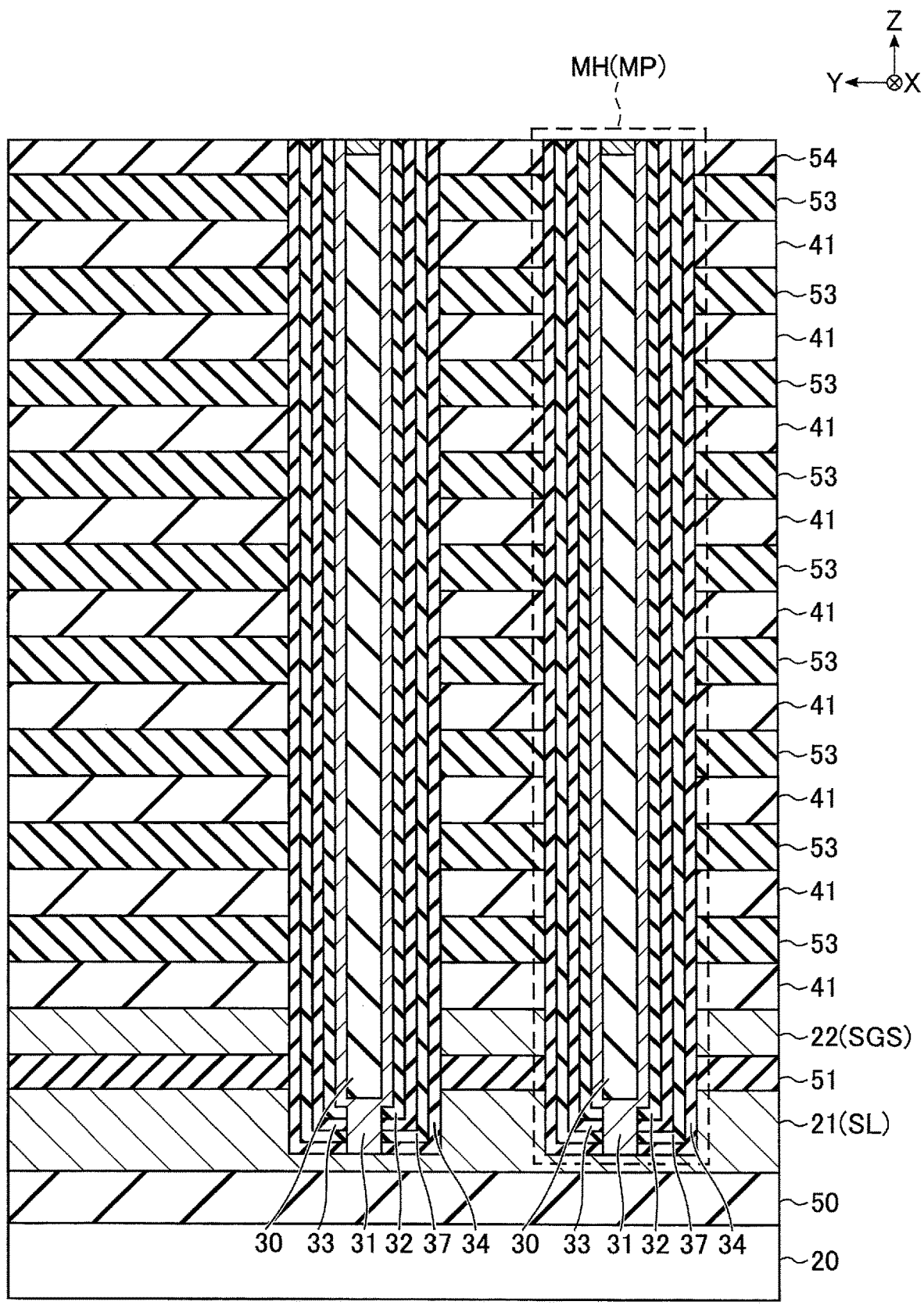

Subsequently, stacked structures are formed in the memory holes MH, as shown in FIG. 8. Specifically, block insulating films 34 and 37, an insulating film 33, and a tunnel insulating film 32 are formed in this order on a side surface and a bottom surface of each memory hole MH.

Thereafter, the block insulating films 34 and 37, the insulating film 33, and the tunnel insulating film 32 are partially removed from the bottom portion of the memory hole MH. Subsequently, a semiconductor layer 31 is formed on a surface of the insulating film 33 in the memory hole MH. The semiconductor layer 31 fills in a region at the bottom portion of the memory hole MH from which the block insulating films 34 and 37, the insulating film 33, and the tunnel insulating film 32 are removed, and is in contact with the conductive layer 21. Subsequently, the core member 30 is formed, and the inside of the memory hole MH is filled with the core member 30. Thereafter, a portion of the core member 30 which is formed at an upper portion of the memory hole MH is removed, and the semiconductor layer 35 is formed in a space formed by the removal. Thereby, a memory pillar MP is formed in the memory hole MH.

Figure 9:
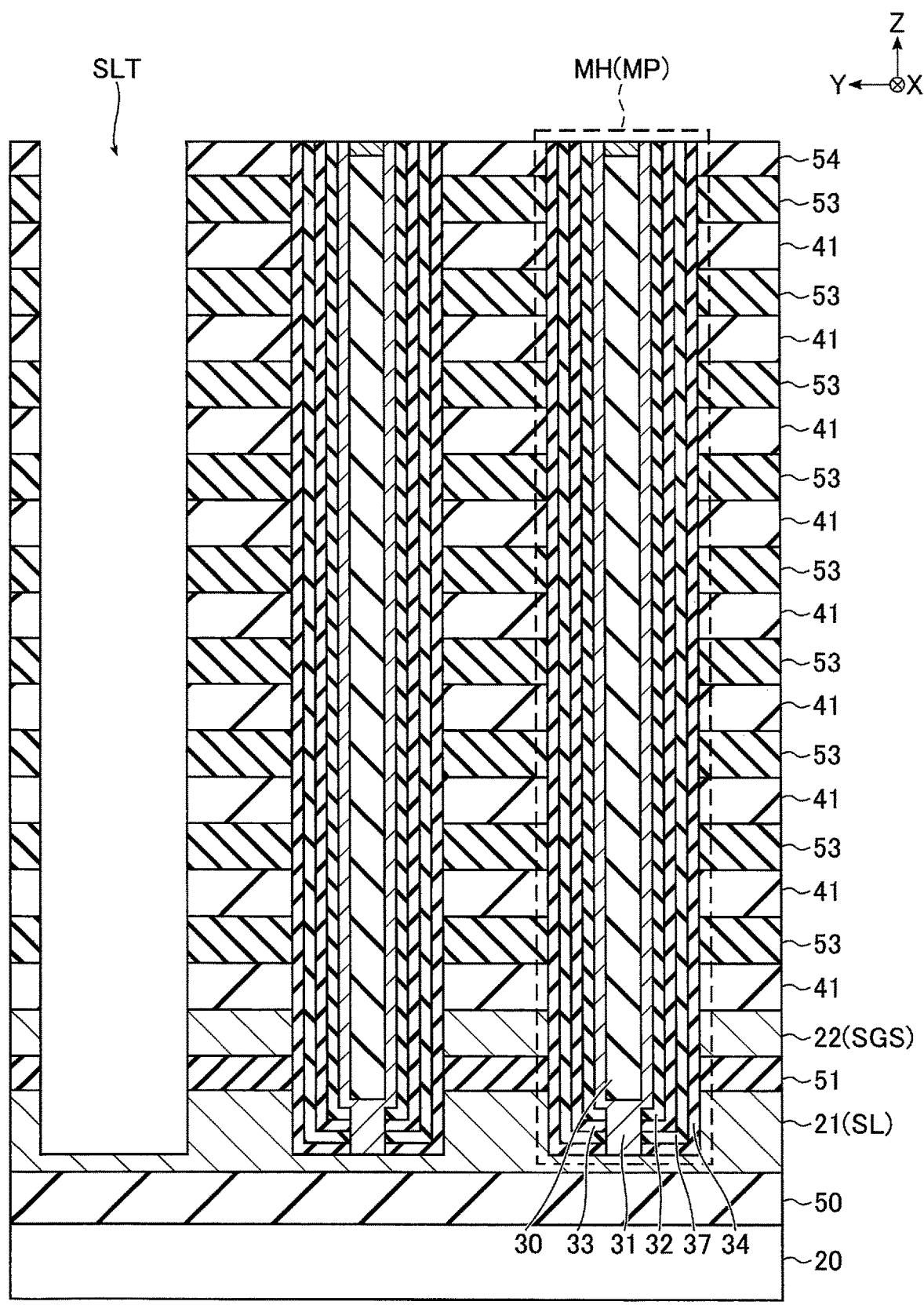

Subsequently, a slit SLT is formed, as shown in FIG. 9. Specifically, a mask including openings at regions in which slits SLT are to be formed is formed by, for example, lithography. Thereafter, slits SLT are formed by anisotropic etching using the formed mask.

Each slit SLT formed in this step partitions each of the insulating layers 51, 41, and 54, the sacrificial member 53, and the conductive layer 22, and the bottom portion of the slit SLT is at, for example, an interior portion of the conductive layer 21 where the anisotropic etching stops. The bottom portion of the slit SLT needs to reach at least the conductive layer 21. RIE, for example, is employed as the anisotropic etching in the present step.

Figure 10:
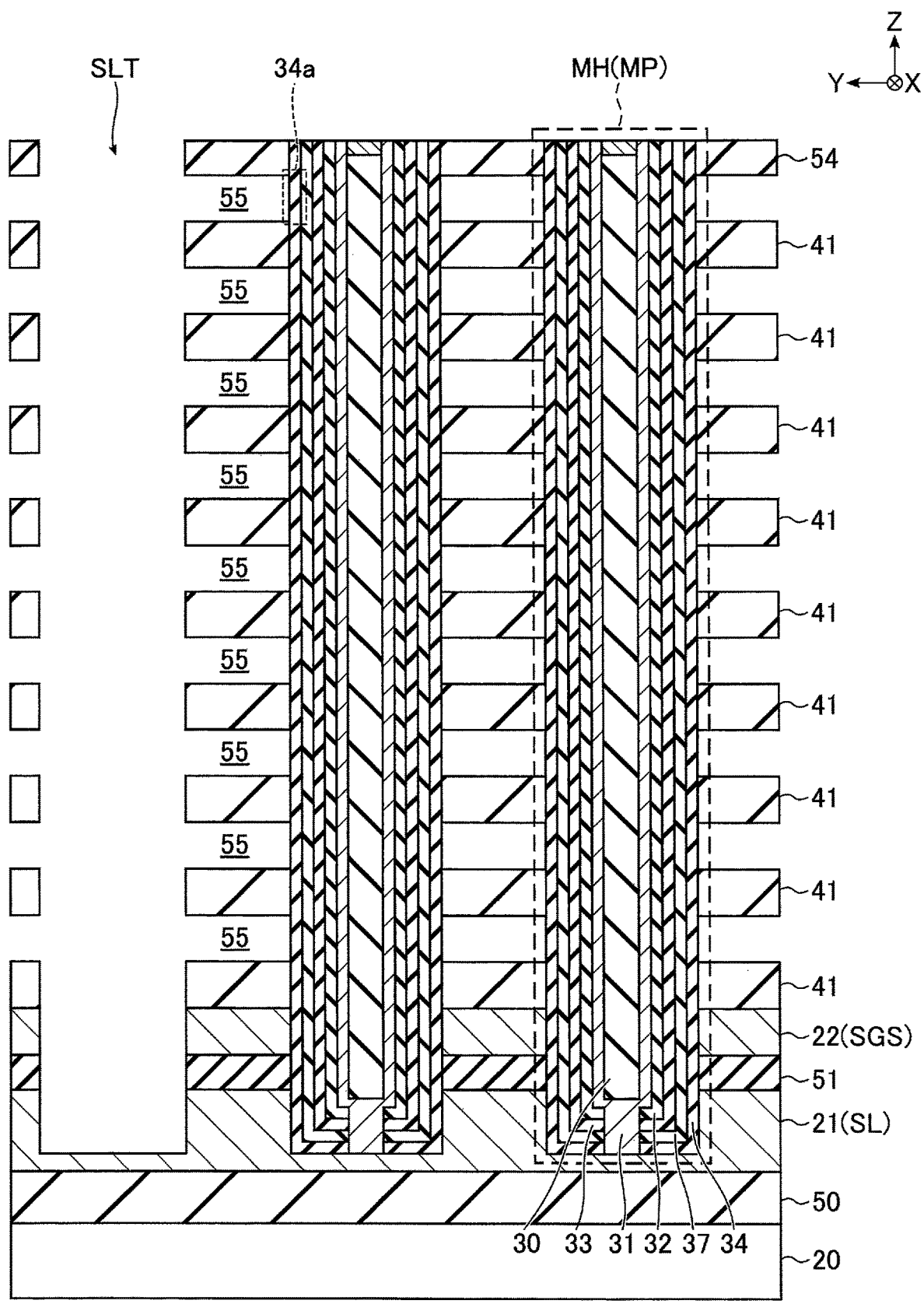

Subsequently, the sacrificial members 53 are removed. First, surfaces of the conductive layers 21 and 22 which are exposed to the inside of the slit SLT are oxidized, and an oxidized protective film, not illustrated, is formed, as shown in FIG. 10. After that, the sacrificial members 53 are selectively removed by wet etching using heated phosphoric acid. The three-dimensional structure from which the sacrificial members 53 have been removed is maintained by, for example, the memory pillars MP. Through the removal of the sacrificial members 53, spaces 55 are formed in the regions in which the sacrificial member 53 were formed. Through the removal of the sacrificial members 53, the block insulating film 34 is exposed at portions 34a between the insulating layers 41, namely, portions 34a that are in contact with the spaces 55.

Figure 11:
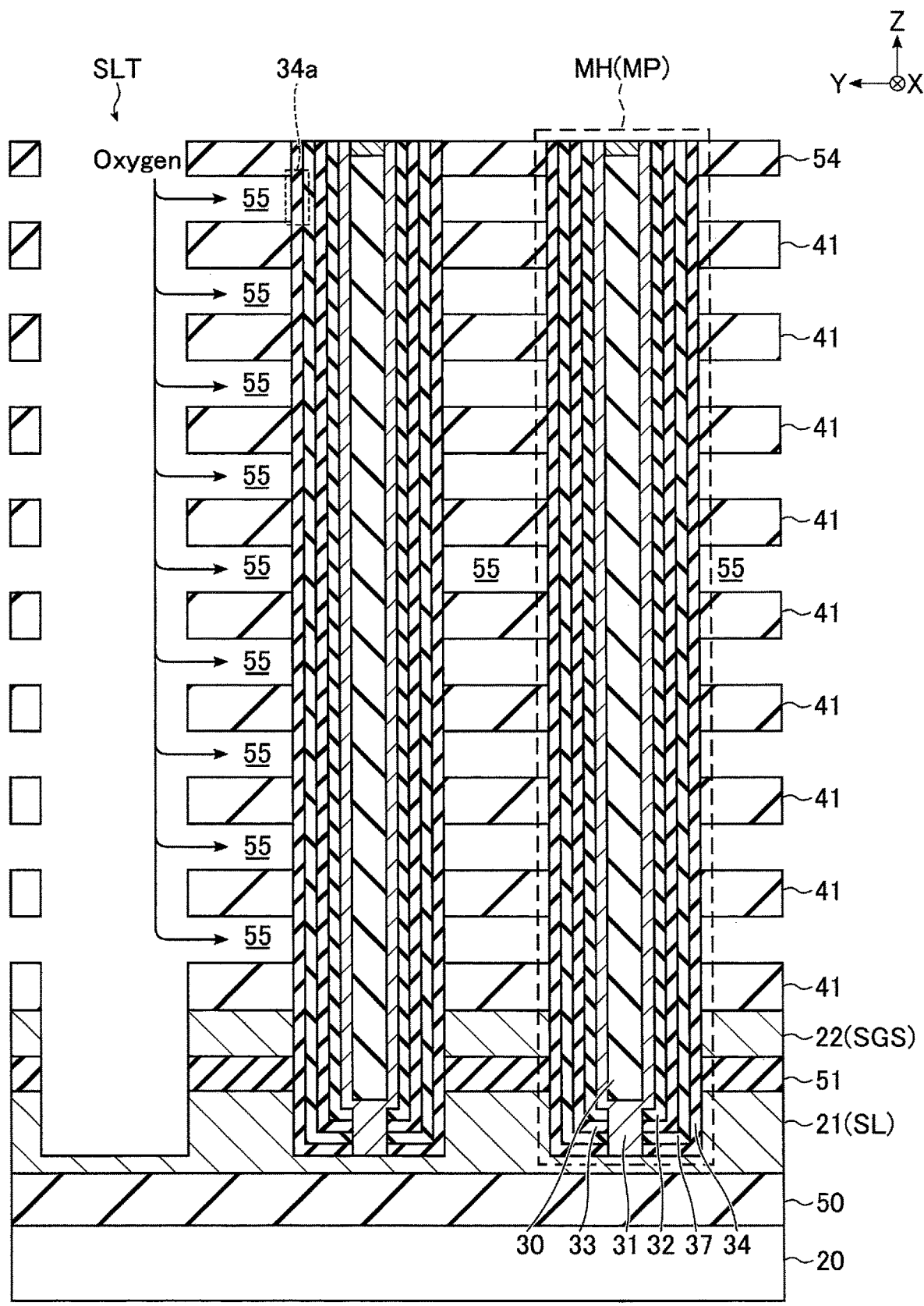

Thereafter, oxygen is transmitted to the spaces 55 via the slit SLT, as shown in FIG. 11. The oxygen selectively oxidizes the portions 34a of the block insulating film 34 which are exposed to the space 55.

Through the oxidization, the portions 34a of the block insulating film 34 change in composition, and become block insulating films 36, as shown in FIG. 12. In the portions 34a of the block insulating film 34, as oxygen is advanced, nitride bonded to the first element is gradually replaced with oxygen. Consequently, the portions 34a of the block insulating film 34 change from nitride to oxide, in accordance with the advancement of the replacement. That is, the aluminum nitride, hafnium nitride, or zirconium nitride contained in the block insulating film 34 are respectively replaced with aluminum oxide, hafnium oxide, or zirconium oxide. The aluminum oxide, hafnium oxide, and zirconium oxide respectively have a higher dielectric constant than the aluminum nitride, hafnium nitride, and zirconium nitride. Accordingly, with the advancement of the oxidization, the block insulating film 36 exhibits a higher dielectric constant than the block insulating film 34.

Figure 13:
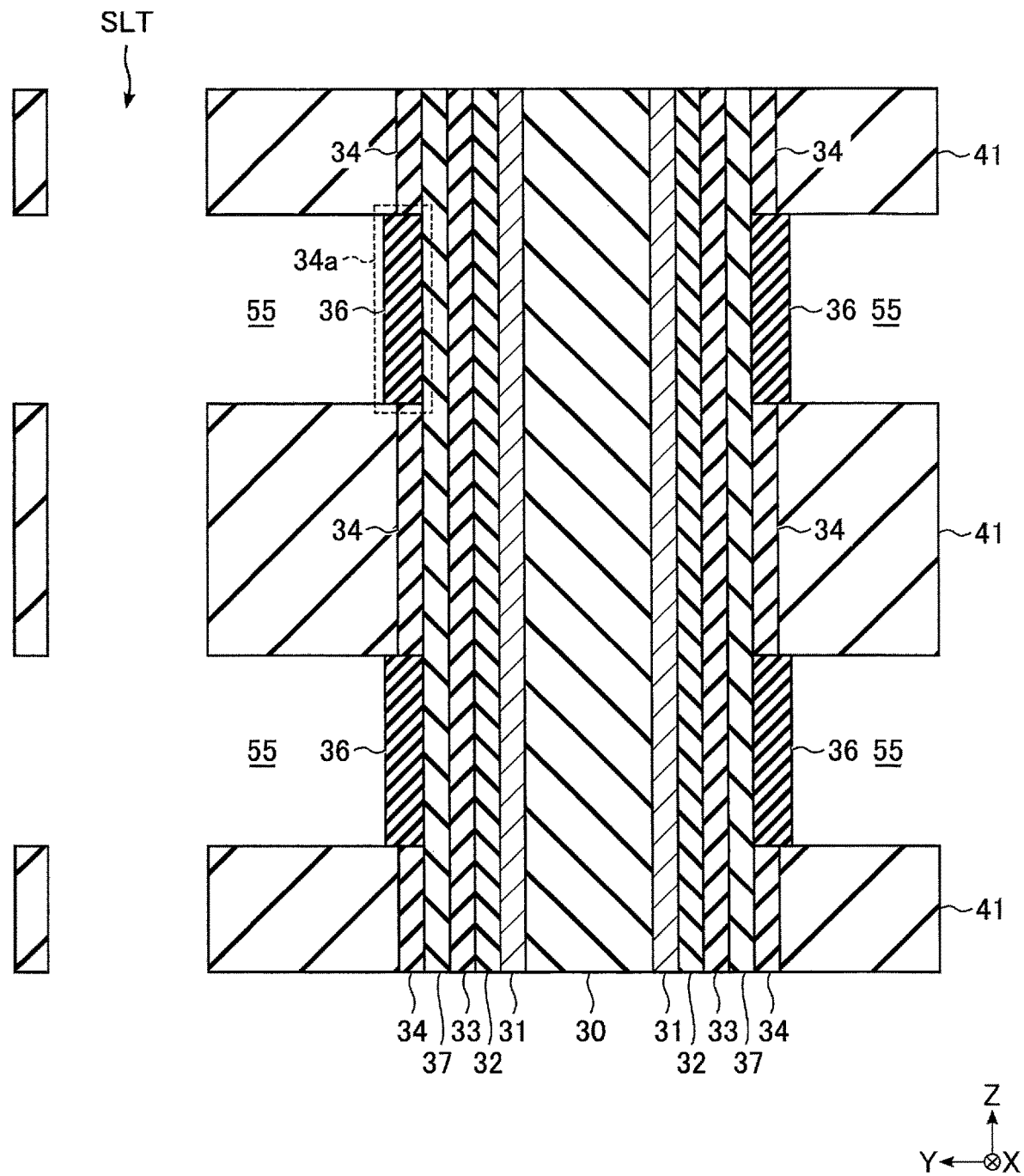
FIG. 13 is an enlarged view of part of FIG. 12.

An enlarged view of FIG. 12 is shown in FIG. 13. As shown in FIG. 13, the portions 34a of the block insulating film 34 change to block insulating films 36. The block insulating films 36 may be formed, for example, not only in portions that are in contact with the spaces 55, but also in portions that are in contact with the insulating layer 41. That is, the oxidization of the block insulating film 34 is advanced from the spaces 55 toward portions that are in contact with the insulating layer 41 above and/or below the spaces 55, and even portions of the block insulating film 34 that are in contact with the insulating layers 41 may change to the block insulating films 36.

The oxygen concentration in the block insulating films 36 may have a gradient over the side of the spaces 55 and the side of the insulating film 37, and the block insulating films 36 need not be completely oxidized over the entire region. It is only required that the block insulating films 36 include portions that have a composition with a higher oxygen concentration than the block insulating film 34. In addition, the block insulating films 36 may be formed, through the oxidization, to have a larger thickness than the block insulating film 34.

Subsequently, as shown in FIGS. 4 and 5, conductors are buried in the spaces 55. The conductors are grown, for example, from portions which are exposed via the slit SLT, such as a side surface of the memory pillar MP. Subsequently, the conductors formed in the slits SLT are removed. Thereby, conductive layers 23 which function as word lines WL0 to WL7 and a conductive layer 25 which functions as a select gate line SGD are formed. Thereafter, an insulator is formed in the slit SLT. After that, a contact MPC is provided on the memory pillar MP. Thereafter, conductive layers 26, which function as bit line BL, are formed on the contact MPC.

Through the above-described steps of manufacturing the semiconductor memory device 1 according to the first embodiment, the memory pillars MP, and the source line SL, the word lines WL, and the select gate lines SGS and SGD coupled to the memory pillars MP are formed. The above-described manufacturing steps are shown merely as an example; any other process may be inserted between the manufacturing steps, and the sequence of the manufacturing steps may be altered within a range such that no problems are caused.

[1. 3.] Advantages (Effects)

With the above-described semiconductor memory device 1 according to the first embodiment, it is possible to decrease the coupling capacitance between adjacent word lines, and to improve the electric characteristics of the memory cell transistors MT. Detailed effects of the semiconductor memory device 1 according to the first embodiment will be described below.

In order to improve the density of memory cell transistors in a semiconductor memory device, the memory cell transistors could be decreased in size. When the memory cell transistors are decreased in size, the block insulating film decreases in thickness. Since the block insulating film plays the role of suppressing a leakage current between a charge storage layer and conductive layers, which function as word lines, the decreased thickness of the block insulating film may cause an increase in the leakage current.

To address this, in some cases, a high dielectric constant material is used as the block insulating film. By using the high dielectric constant material, even if the block insulating film is formed to have a large thickness to prevent the leakage current, the high dielectric constant allows for prevention of deterioration of the electric characteristics of the memory cell transistors.

However, by using the high dielectric constant material as the block insulating film, a phenomenon occurs in which the coupling capacitance may unintentionally increase at a certain position. Such a phenomenon that may occur in the case of use of a high dielectric constant material as the block insulating film will be described with reference to FIG. 14. FIG. 14 is a cross-sectional view of a referential example of a semiconductor memory device, and shows a portion similar to that in the cross section of FIG. 5. As shown in FIG. 14, in a semiconductor memory device in which a high dielectric constant material is used as a block insulating film, the entire portion on the outermost periphery of the memory pillar MP is formed of a block insulating film 61 using a high dielectric constant material.

However, through the formation of the high dielectric constant material not only in a portion adjacent to the conductive layer 23 but also in a portion adjacent to the insulating layer 41, the coupling capacitance C1 between conductive layers 23 that are adjacent to each other via the insulating layer 41 may increase. This is because the coupling capacitance C1 between the conductive layers 23 adjacent to each other via the insulating layer 41 increases, for example, in proportion to the dielectric constant of a material of a portion in the memory pillar MP which faces the insulating layer 41. With the increase in the coupling capacitance C1, charging of the word lines WL requires a large amount of time, causing possible deterioration of the performance of the semiconductor memory device.

On the other hand, in the semiconductor memory device 1 according to the first embodiment, a block insulating film 36 formed using a high dielectric constant material is provided only at the periphery of a portion adjacent to a conductive layer 23, and a block insulating film 34 formed using a low dielectric constant material is provided at the periphery of a portion adjacent to an insulating layer 41.

Consequently, as shown in FIG. 15, which shows the coupling capacitance C2 in addition to FIG. 5, the coupling capacitance C2 between the conductive layers 23 that are adjacent to each other via the insulating layer 41 becomes smaller than the coupling capacitance C1. This allows the coupling capacitance between adjacent word lines WL to be decreased, thus improving the electric characteristics of the semiconductor memory device 1.

Moreover, in a portion adjacent to the conductive layer 23, a block insulating film 36 is formed using a high dielectric constant material. By virtue of the high dielectric constant, the block insulating film 36 can be formed to have a large thickness, thus maintaining the effect of suppressing the leakage current between the conductive layer 23 and the insulating film 33 (charge storage layer).

Accordingly, the semiconductor memory device 1 according to the first embodiment is capable of suppressing both the coupling capacitance between the conductive layers 23 and the leakage current between the conductive layer 23 and the insulating film 33.

[2] Other Modifications

[2.1.] Modification of First Embodiment

Figure 16:
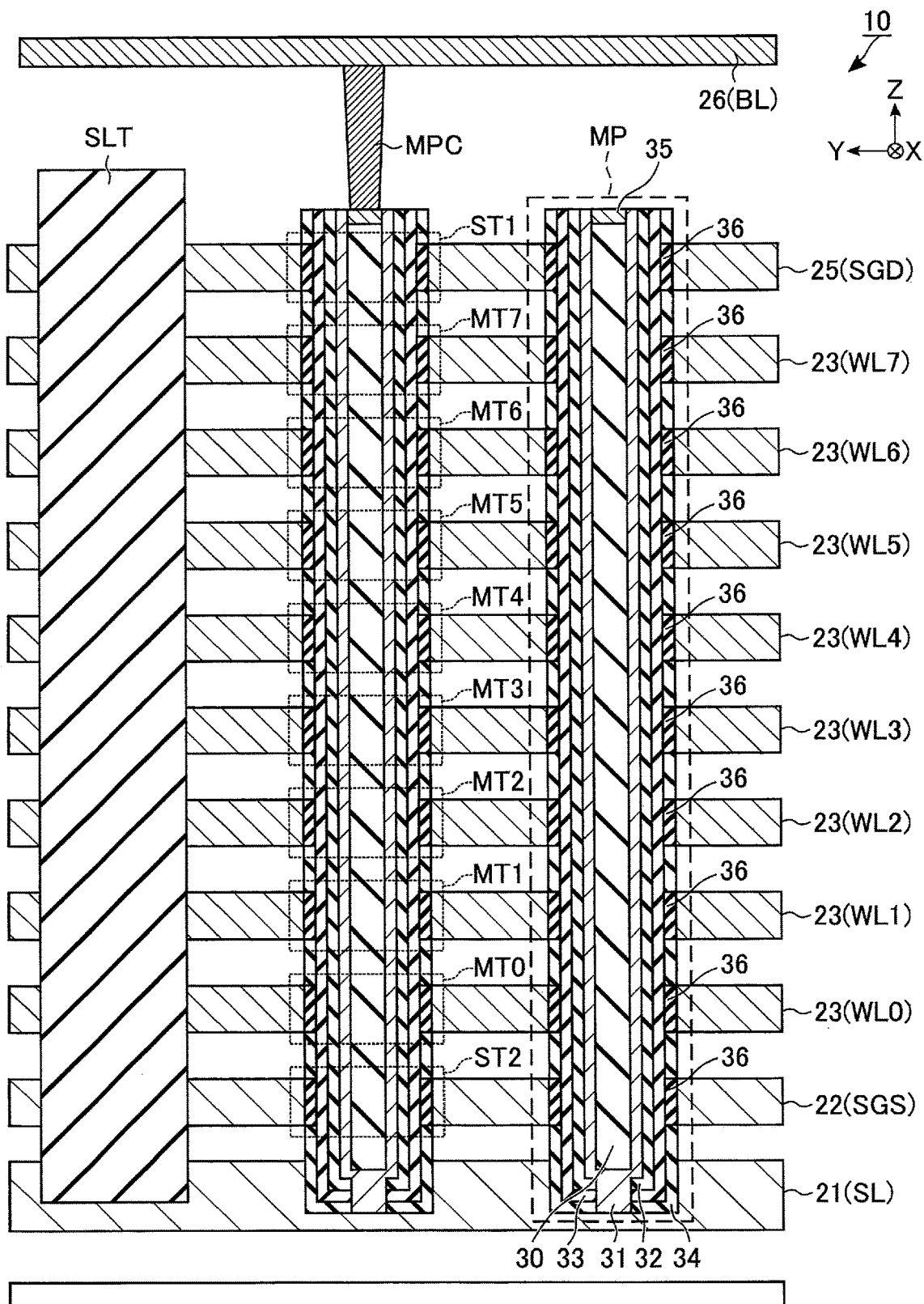
FIG. 16 is a cross-sectional view showing an example of a cross-sectional structure of a memory cell array included in a semiconductor memory device according to a modification.

A modification of the first embodiment will be described with reference to FIGS. 16 and 17. FIG. 16 shows an example of a cross-sectional structure of a memory cell array 10 included in a semiconductor memory device 1 according to the modification of the first embodiment. FIG. 17 is an enlarged view of part of FIG. 16. FIGS. 16 and 17 respectively show the same portions as those in FIGS. 4 and 5. Hereinafter, a description will be given mainly of features different from those described with reference to FIGS. 4 and 5.

This modification adopts a structure in which the block insulating film 37 of the first embodiment is not provided and an insulating film 33 is in contact with block insulating films 34 and 36; the structure other than that is the same as that of the first embodiment.

Specifically, as shown in FIG. 16, each of the memory pillars MP includes, for example, a core member 30, a semiconductor layer 31, a tunnel insulating film 32, an insulating film 33, block insulating films 34 and 36, and a semiconductor layer 35.

The block insulating film 34 covers a bottom surface of the insulating film 33 and a portion of a side surface of the insulating film 33 which is not adjacent to the conductive layer 25. The block insulating film 36 is formed between the side surface of the insulating film 33 and the conductive layer 25. In other words, the block insulating film 34 and the block insulating film 36 are alternately formed as viewed in the Z direction on the side surface of the insulating film 33.

The structure of the block insulating films 34 and 36 will be further described, with reference to FIG. 17. The block insulating films 36 are formed, for example, between the conductive layers 22, 23, and 25 and the insulating film 33, but may be formed in portions that are in contact with the insulating layers 41. That is, an upper end and a lower end of the block insulating film 36 may be formed between the insulating film 33 and the insulating layer 41 above and/or below the block insulating film 36. Also, the block insulating film 36 may be formed to have a thickness larger than the block insulating film 34.

[2.2.] Advantages (Effects)

The above-described modification is, for example, applicable to the case where a leakage current between the conductive layer 23 and the insulating film 33 (charge storage layer) can be suppressed even if the block insulating film 37 of the first embodiment is not provided.

The modification is capable of suppressing both the coupling capacitance between the conductive layers 23 and the leakage current between the conductive layers 23 and the insulating film 33, similarly to the semiconductor memory device 1 of the first embodiment.

In addition, according to the modification, since the number of block insulating films can be decreased by one, it is possible to decrease the size of the memory cell transistors, thus improving the density of the memory cell transistors.

[2.3.] Other Modifications

In the first embodiment, a case has been described where a semiconductor layer 31 in a memory pillar MP is electrically coupled to a conductive layer 21 (source line SL) via a bottom surface of the memory pillar MP; however, the first embodiment is not limited thereto. The semiconductor memory device 1 may be configured, for example, in such a manner that a semiconductor layer 31 and a source line SL in a memory pillar MP are coupled via a side surface of the memory pillar MP.

In the first embodiment, a memory pillar MP may have a structure in which two or more pillars are coupled as viewed in the Z direction. Also, a memory pillar MP may have a structure in which a pillar corresponding to a select gate line SGD and a pillar corresponding to a word line WL are coupled. The arrangement of memory pillars MP is not limited to the four-row staggered arrangement, and any other arrangement may be adopted. The number of bit lines BL that overlap each memory pillar MP may be designed to be any number.

In the drawings to which reference has been made in the first embodiment, a case is described where the outer diameter of the memory pillar MP does not change according to the position of the layer; however, the first embodiment is not limited thereto. For example, the memory pillar MP may have a tapered or anti-tapered shape, or have a shape that bulges at the middle.

In the present specification, the term "couple" refers to electrical coupling, and does not exclude intervention of another element. An insulator may intervene in the electric coupling as long as such coupling is capable of operating in a manner similar to the electrical coupling without intervention of an insulator. The term "pillar-shaped" is used to refer to a structure provided in a hole formed in the manufacturing steps of the semiconductor memory device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a semiconductor extending in a first direction;
    a first insulator provided on the semiconductor and extending in the first direction;
    a second insulator provided on the first insulator and extending in the first direction;
    a first conductor;
    a third insulator provided on and above the first conductor;
    a fourth insulator provided between the second insulator and the first conductor in a second direction crossing the first direction; and
    a fifth insulator provided above the fourth insulator and provided between the second insulator and the third insulator in the second direction, and having an oxygen concentration different from an oxygen concentration of the fourth insulator.

2. The semiconductor memory device according to claim 1, further comprising:
    a sixth insulator formed on the second insulator and being in contact with both the fourth insulator and the fifth insulator.

3. The semiconductor memory device according to claim 1, wherein
    the fourth insulator comprises an oxide of a first material, and
    the fifth insulator comprises a nitride of the first material.

4. The semiconductor memory device according to claim 3, wherein
the first material comprises aluminum, zirconium, or hafnium.

5. The semiconductor memory device according to claim 1, wherein
the fourth insulator comprises an aluminum oxide, and the fifth insulator comprises an aluminum nitride.

6. The semiconductor memory device according to claim 1, wherein
the fourth insulator has a thickness different from a thickness of the fifth insulator.

7. The semiconductor memory device according to claim 1, wherein
the second insulator and the fourth insulator are in contact with each other, and
the second insulator and the fifth insulator are in contact with each other.

8. The semiconductor memory device according to claim 7, wherein
the fourth insulator and the fifth insulator are aligned in the first direction.

9. The semiconductor memory device according to claim 8, wherein
the semiconductor, the first insulator, the second insulator, and the fourth insulator are aligned in the second direction.

10. The semiconductor memory device according to claim 9, wherein
the first conductor extends along the second direction, and is in contact with the fourth insulator as viewed in the second direction, and
the third insulator extends along the second direction, and is in contact with the fifth insulator as viewed in the second direction.

11. The semiconductor memory device according to claim 10, further comprising:
a bit line; and
a source line, wherein
a portion between the first conductor and the semiconductor functions as a memory cell transistor, and
the memory cell transistor is coupled between the bit line and the source line.

12. The semiconductor memory device according to claim 1, wherein
the fourth insulator is thicker than the fifth insulator.

13. The semiconductor memory device according to claim 1, wherein
the second insulator functions as a charge storage layer.

14. A semiconductor memory device, comprising:
a semiconductor extending in a first direction;
a first insulator provided on the semiconductor and extending in the first direction;
a second insulator provided on the first insulator and extending in the first direction;
a first conductor;
a third insulator provided on and above the first conductor;
a fourth insulator provided between the second insulator and the first conductor in a second direction crossing the first direction; and
a fifth insulator provided above the fourth insulator and provided between the second insulator and the third insulator in the second direction, and having a dielectric constant different from a dielectric constant of the fourth insulator.

15. The semiconductor memory device according to claim 14, wherein
the fourth insulator comprises an oxide of a first material, and
the fifth insulator comprises a nitride of the first material.

16. The semiconductor memory device according to claim 14, wherein
the fourth insulator comprises an aluminum oxide, and the fifth insulator comprises an aluminum nitride.

17. The semiconductor memory device according to claim 14, wherein
the second insulator and the fourth insulator are in contact with each other, and
the second insulator and the fifth insulator are in contact with each other.

18. The semiconductor memory device according to claim 14, wherein
the semiconductor, the first insulator, and the second insulator are aligned in the second direction,
the second insulator and the fourth insulator are in contact with each other as viewed in the second direction,
the second insulator and the fifth insulator are in contact with each other as viewed in the second direction,
the fourth insulator and the fifth insulator are aligned in the first direction,
the first conductor extends along the second direction, and is in contact with the fourth insulator as viewed in the second direction, and
the third insulator extends along the second direction, and is in contact with the fifth insulator as viewed in the second direction.

19. The semiconductor memory device according to claim 18, further comprising:
a bit line; and
a source line, wherein
a portion between the first conductor and the semiconductor functions as a memory cell transistor, and
the memory cell transistor is coupled between the bit line and the source line.

* * * * *